(12) United States Patent
Tsuboi

(10) Patent No.: US 12,178,076 B2
(45) Date of Patent: Dec. 24, 2024

(54) LIGHT EMITTING APPARATUS

(71) Applicant: CANON KABUSHIKI KAISHA, Tokyo (JP)

(72) Inventor: Hiromasa Tsuboi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 540 days.

(21) Appl. No.: 17/532,955

(22) Filed: Nov. 22, 2021

(65) Prior Publication Data

US 2022/0173190 A1 Jun. 2, 2022

(30) Foreign Application Priority Data

Nov. 27, 2020 (JP) .................................. 2020-196896

(51) Int. Cl.
*H10K 59/121* (2023.01)
*H10K 59/131* (2023.01)

(52) U.S. Cl.
CPC ..... *H10K 59/1213* (2023.02); *H10K 59/1216* (2023.02); *H10K 59/131* (2023.02)

(58) Field of Classification Search
CPC ........... H10K 59/1213; H10K 59/1216; H10K 59/131
See application file for complete search history.

(56) References Cited

U.S. PATENT DOCUMENTS

| | | | | |
|---|---|---|---|---|
| 2010/0330723 | A1* | 12/2010 | Okabe | ............... H01L 27/14632 |
| | | | | 257/E31.095 |
| 2012/0019498 | A1* | 1/2012 | Jeong | ................... G09G 3/3233 |
| | | | | 345/76 |
| 2019/0244958 | A1* | 8/2019 | Aurola | ............ H01L 21/823807 |
| 2020/0126481 | A1 | 4/2020 | Tsuboi | |

FOREIGN PATENT DOCUMENTS

JP 2020064265 A 4/2020

* cited by examiner

*Primary Examiner* — Mohammad A Rahman
*Assistant Examiner* — Sandra Milena Rodriguez Villan
(74) *Attorney, Agent, or Firm* — Canon U.S.A., Inc. IP Division

(57) ABSTRACT

An apparatus includes a pixel that includes a current path including a light emitting element and a first transistor, a second transistor, and a third transistor connected to a signal wire. One of source and drain regions of the second transistor is connected to one node of the light emitting element and a first power supply. One of source and drain regions of the third transistor is connected to a gate electrode of the first transistor. An isolation portion is disposed between a first conductivity type first diffusion region that makes up one of the source and drain regions of the second transistor and a first conductivity type second diffusion region that makes up one of the source and drain regions of the third transistor. A depth of the first diffusion region is greater than a depth of the second diffusion region.

20 Claims, 16 Drawing Sheets

LIGHT EMITTING APPARATUS

BACKGROUND OF THE DISCLOSURE

Field of the Disclosure

The aspect of the embodiments relates to a light emitting apparatus.

Description of the Related Art

There is known a display apparatus in which pixels including light emitting elements, such as organic light emitting diode (OLED) elements that each emit light at a luminance corresponding to a current flowing through the element, are arranged in an array. Japanese Patent Laid-Open No. 2020-064265 describes a structure in which, in a plurality of transistors including a transistor for transmitting a luminance signal, the depths of diffusion regions that make up the drains of the transistors are equal to each other.

With the structure described in Japanese Patent Laid-Open No. 2020-064265, electrons or holes from lattice defects present in a pixel flow into the drain of the transistor for transmitting a luminance signal, and, as a result, a signal voltage held by the drain changes. For example, the amount of current supplied to a light emitting element and the luminance of the light emitting element change.

SUMMARY OF THE DISCLOSURE

An apparatus includes a pixel that includes a current path including a light emitting element and a first transistor, a second transistor, and a third transistor connected to a signal wire. One of a source region and a drain region of the second transistor is connected to one node of the light emitting element and a first power supply. One of a source region and a drain region of the third transistor is connected to a gate electrode of the first transistor. An isolation portion is disposed between a first conductivity type first diffusion region that makes up one of the source region and the drain region of the second transistor and a first conductivity type second diffusion region that makes up one of the source region and the drain region of the third transistor. A depth of the first diffusion region is greater than a depth of the second diffusion region.

Further features of the disclosure will become apparent from the following description of exemplary embodiments with reference to the attached drawings.

DESCRIPTION OF THE EMBODIMENTS

Figure 1:
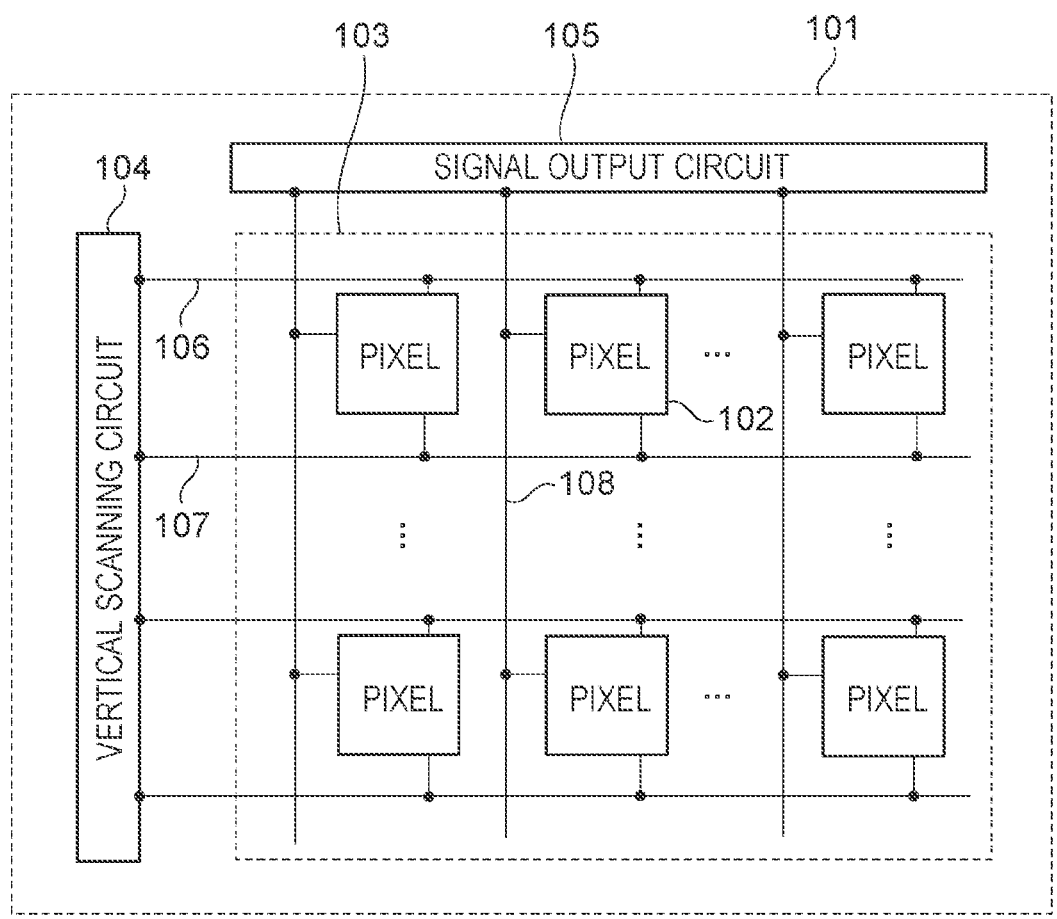
FIG. 1 is a diagram showing a configuration example of a light emitting apparatus according to a first embodiment.

Next, light emitting apparatuses according to embodiments will be described with reference to the attached drawings. Any of the following embodiments is an example of the disclosure, and numeric values, shapes, materials, components, arrangement and connection modes of components, and the like do not limit the disclosure. In the following description and the drawings, like reference signs are assigned to common components over a plurality of the drawings. The description of portions to which the same reference signs are assigned in the drawings may be omitted.

Hereinafter, the case where driving transistors are connected to positive electrodes of OLED elements and all the transistors are P-type transistors will be described; however, the light emitting apparatus according to the aspect of the embodiments is not limited thereto. The polarity and the conductivity type both may be opposite. The driving transistors may be P-type transistors, and the other transistors may be N-type transistors. A potential to be supplied or connection just is to be changed as needed in accordance with a light emitting element and the conductivity type and polarity of each of transistors included in each pixel of the light emitting apparatus.

In the specification, when the term "impurity concentration" is merely used, it means a net impurity concentration obtained by subtracting an amount compensated by reverse conductivity type impurities. In other words, "impurity concentration" indicates a net doping concentration. A region where a P-type additive impurity concentration is higher than an N-type additive impurity concentration is a P-type semiconductor region. Conversely, a region where an N-type additive impurity concentration is higher than a P-type additive impurity concentration is an N-type semiconductor region.

First Embodiment

A light emitting apparatus 101 according to a first embodiment will be described with reference to FIG. 1 to FIG. 4. FIG. 1 is a schematic diagram of the configuration of an active matrix display apparatus including the light emitting apparatus 101 according to the present embodiment. As shown in FIG. 1, the light emitting apparatus 101 includes a pixel array section 103, and a driving section disposed around the pixel array section 103. The pixel array section 103 includes a plurality of pixels 102 arranged in a two-dimensional matrix. Each pixel 102 includes a light emitting element 201 shown in FIG. 2. For example, a current drive-type electro-optic element of which the emission luminance changes in accordance with a current value flowing through the element is used as the light emitting element 201. The electro-optic element is, for example, an OLED element. Hereinafter, the case where the electro-optic element is an OLED element will be described. The light emitting element 201 has an organic layer including a light emitting layer between a positive electrode and a negative electrode. The organic layer may have at least one of a hole injection layer, a hole transport layer, an electron injection layer, and an electron transport layer in addition to the light emitting layer.

The driving section is a circuit for driving the pixels 102. The driving section includes, for example, a vertical scanning circuit 104 and a signal output circuit 105 In FIG. 1, in the pixel array section 103, a first scanning wire 106 and a second scanning wire 107 are disposed in a row direction for each pixel row. A signal wire 108 is disposed in a column direction for each pixel column.

The first scanning wires 106 and the second scanning wires 107 are connected to output terminals of associated rows in the vertical scanning circuit 104. The signal wires 108 are connected to output terminals of associated columns in the signal output circuit 105.

The vertical scanning circuit 104 is made up of, for example, a shift register that sequentially shifts a start pulse in synchronization with a clock pulse. The vertical scanning circuit 104 supplies write control signals to the first scanning wires 106 at the time of writing video signals to the pixels 102 of the pixel array section 103. The vertical scanning circuit 104 supplies reset signals to the second scanning wires 107 in a non-emission period.

The signal output circuit 105 outputs signal voltages (luminance signals) corresponding to video signals according to luminance information supplied from an external device. The output signal voltages are supplied to the associated pixels 102 via the signal wires 108.

The driving section does not need to be disposed around the pixel array section 103. For example, the pixel array section 103 may be disposed on a first substrate, at least part of the driving section may be disposed on a second substrate, and the first substrate and the second substrate may be laminated.

In the specification, when the light emitting apparatus 101 supports black and white display, one pixel that is a unit to form a black and white image corresponds to the pixel 102. On the other hand, when the light emitting apparatus 101 supports color display, one pixel that is a unit to form a color image is made up of a plurality of sub-pixels, and the sub-pixel corresponds to the pixel 102. More specifically, in a display apparatus that supports color display, one pixel is made up of, for example, three sub-pixels, that is, a sub-pixel that emits red (R) light, a sub-pixel that emits green (G) light, and a sub-pixel that emits blue (B) light.

However, one pixel is not limited to a combination of RGB three primary color sub-pixels. In other words, one pixel may be made up of three primary color sub-pixels and further one or more color sub-pixels. More specifically, for example, one pixel may be made by adding a sub-pixel that emits white (W) light to improve luminance or one pixel may be made by adding at least one sub-pixel that emits a complementary color to expand a color reproduction range.

Figure 2:
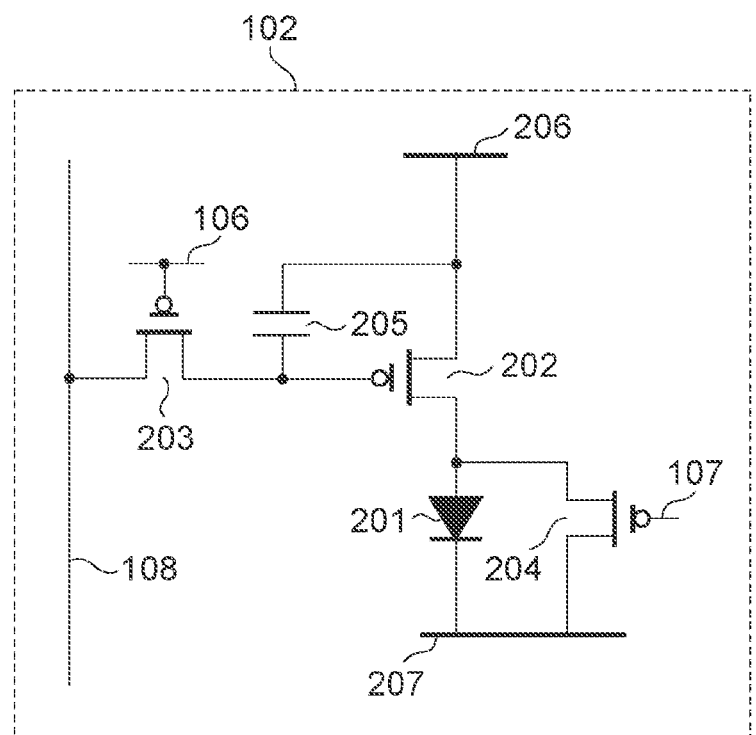
FIG. 2 is a circuit diagram showing a configuration example of a pixel of the light emitting apparatus according to the first embodiment.

FIG. 2 is a circuit diagram showing a configuration example of each pixel 102 of the light emitting apparatus 101 of FIG. 1. As shown in FIG. 2, the pixel 102 is made up of, for example, an OLED element that functions as the light emitting element 201 and a driving circuit that drives the light emitting element 201. The pixel 102 includes the light emitting element 201, a driving transistor 202 (first transistor), and a write transistor 203 (third transistor). The pixel 102 further includes a switching transistor 204 (second transistor) that controls emission and non-emission of the light emitting element 201, and a first capacitative element 205. The switching transistor 204 is a transistor for short-circuiting two terminals (an anode and a cathode) of the light emitting element 201.

Here, the total number of transistors and capacitative elements and a combination of conductivity types of transistors are only illustrative and are not limited to this configuration. The total number of transistors and capacitative elements may be made equal among a plurality of pixels or a pixel having a different total number of transistors and capacitative elements may be included in a light emitting apparatus. When, for example, a light emitting apparatus is used as a display apparatus that supports color display, the configuration may be changed according to colors. For example, the capacitance value of the first capacitative element 205 in a sub-pixel that emits blue light may be made greater than the capacitance value of the first capacitative element 205 in a sub-pixel that emits green light. In the following description, when it is described that a transistor is connected between an element A and an element B, one terminal (a source region or a drain region) of the transistor is connected to the element A, and the other terminal of the transistor is connected to the element B.

Next, the specific circuit arrangement of the pixel 102 will be described with reference to FIG. 2. In the present embodiment, one end of a current path including the light emitting element 201, the driving transistor 202, and the switching transistor 204 is connected to a power supply potential Vss, and the other end is connected to a power supply potential Vdd. More specifically, a first electrode (negative electrode) of the light emitting element 201 and one terminal (the drain region in FIG. 2) of the switching transistor 204 are connected to the power supply potential Vss. The positive electrode of the light emitting element 201 and the other terminal (the source region in FIG. 2) of the switching transistor 204 are connected to the power supply potential Vdd via the driving transistor 202. In FIG. 2, the power supply potential Vdd is higher than the power supply potential Vss.

One terminal (the drain region in FIG. 2) of the write transistor 203 is connected to the gate of the driving transistor 202, and the other terminal (the source region in FIG. 2) of the write transistor 203 is connected to the signal wire 108. The gate of the write transistor 203 is connected to the first scanning wire 106.

One terminal (the drain region in FIG. 2) of the switching transistor 204 is connected to the power supply potential Vss 207. The gate of the switching transistor 204 is connected to the second scanning wire 107. When the positive electrode of the light emitting element 201 is connected to the power supply potential Vss 207 by turning on the switching transistor 204 in a non-emission period, the light emitting element 201 is set to a non-emission state.

The first capacitative element 205 is connected between a node connected to the gate of the driving transistor 202 and a node of the source. The first capacitative element 205 may have at least one of a parasitic capacitance and a metal-insulator-metal (MIM) structure.

The driving transistor 202 supplies a current from the power supply potential Vdd 206 to the light emitting element 201 to cause the light emitting element 201 to emit light. More specifically, the driving transistor 202 supplies a current according to a signal voltage of the signal wire 108 to the light emitting element 201. Thus, the light emitting element 201 is driven by current to emit light.

A write control signal is supplied to the gate of the write transistor 203 from the vertical scanning circuit 104 through the first scanning wire 106. The write transistor 203 is controlled between a conductive state and a non-conductive state in accordance with a write control signal. The write transistor 203 is able to transmit a luminance signal to the light emitting element 201. By setting the write transistor 203 to the conductive state, the write transistor 203 samples a signal voltage of a luminance signal according to luminance information supplied from the signal output circuit 105 through the signal wire 108 and writes the signal voltage in the pixel 102. The written signal voltage is applied to the gate of the driving transistor 202.

An OLED element can be used as the light emitting element 201. When the light emitting element 201 emits light, the amount of current flowing through the driving transistor 202 changes according to a signal voltage applied to the gate of the driving transistor 202 through the write transistor 203 from the signal wire 108. Thus, the capacitance between the positive electrode and the negative electrode of the light emitting element 201 is changed to a predetermined potential, and a current according to the potential difference flows. Thus, the light emitting element 201 emits light at a predetermined luminance.

Figure 3:
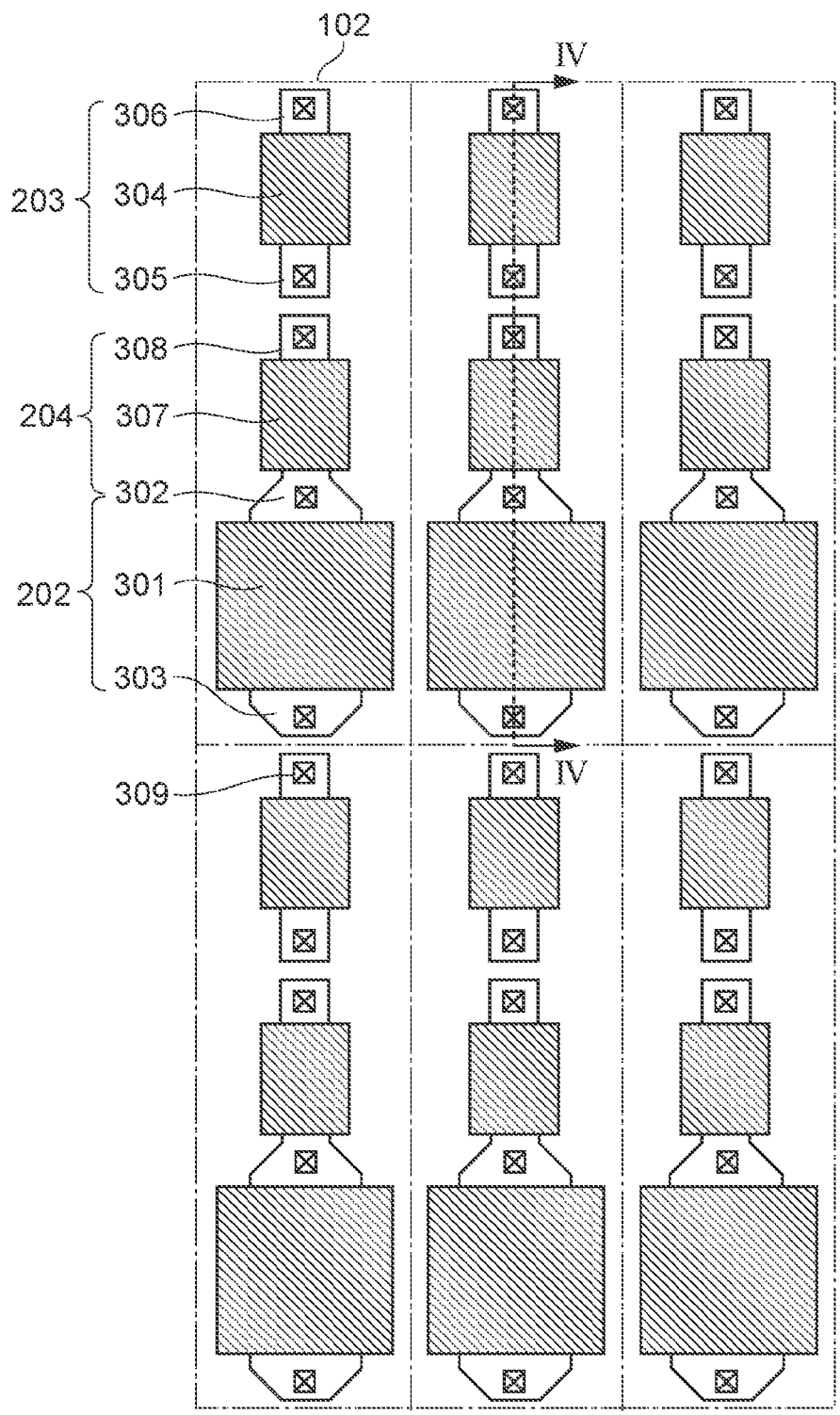
FIG. 3 is a schematic plan view showing a configuration example of pixels of the light emitting apparatus according to the first embodiment.

FIG. 3 is a schematic plan view of a plurality of the pixels 102. Each driving transistor 202 is made up of a gate electrode 301, a P-type diffusion region 302 that functions as one of a source region and a drain region, and a P-type diffusion region 303 that functions as the other one of the source region and the drain region. In FIG. 3, the gate electrode 301 is connected to one terminal of the first capacitative element 205 of FIG. 2, and the diffusion region 303 is connected to the other terminal of the first capacitative element 205. The diffusion region 303 is further connected to the power supply potential Vdd 206. The diffusion region 302 is connected to the positive electrode of the light emitting element 201.

Each write transistor 203 is made up of a gate electrode 304, a P-type diffusion region 305 that functions as one of a source region and a drain region, and a P-type diffusion region 306 that functions as the other one of the source region and the drain region. In FIG. 3, the diffusion region 305 functions as the drain region, and the diffusion region 306 functions as the source region. The diffusion region 305 is connected to the gate electrode 301 of the driving transistor 202 and holds a signal voltage. When the write transistor 203 is in an off state, the potential of the diffusion region 305 that functions as the drain region of the write transistor 203 and the potential of the gate electrode of the driving transistor 202 are in a floating state. The potential of the gate electrode 301 of the driving transistor 202 is equal to the potential of the diffusion region 305 that functions as the drain region of the write transistor 203. The potential of the gate electrode 301 of the driving transistor 202 determines the drain current of the driving transistor 202 and determines the luminance of the light emitting element 201. The diffusion region 306 is connected to the signal wire 108, and the gate electrode 304 is connected to the first scanning wire 106.

Each switching transistor 204 is made up of a gate electrode 307, the P-type diffusion region 302 that functions as one of a source region and a drain region, and a P-type diffusion region 308 that functions as the other one of the source region and the drain region. The gate electrode 307 is connected to the second scanning wire 107. The diffusion region 302 is shared between the driving transistor 202 and the switching transistor 204. However, the configuration is not limited thereto. The diffusion region of the driving transistor 202 and the diffusion region of the switching transistor 204 may be independent of each other. The diffusion region 308 is connected to the power supply potential Vss 207. In plan view, the diffusion region closest to the diffusion region 308 is the diffusion region 305. A contact plug 309 is connected to each of the source regions and the drain regions.

A region to which the contact plug 309 is connected may be higher in impurity concentration than the source region or the drain region therearound. For example, in each of the source region and the drain region, the impurity concentration of a portion to which a contact plug is connected may be higher than the impurity concentration of a portion that forms an interface with a well 402.

Figure 4:
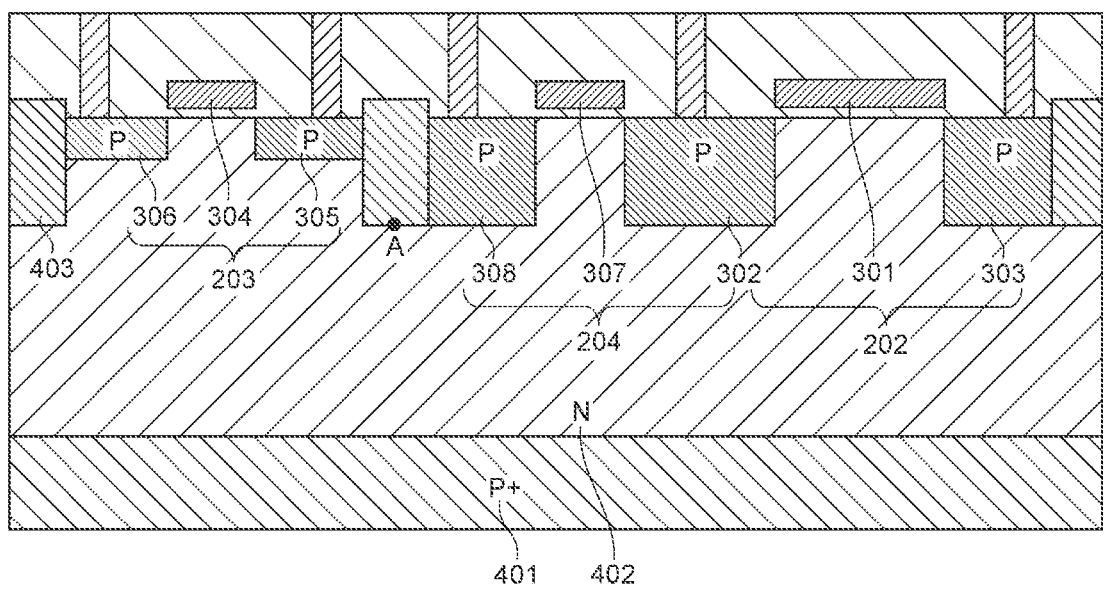
FIG. 4 is a schematic sectional view showing a configuration example of a pixel of the light emitting apparatus according to the first embodiment.

FIG. 4 is a sectional view taken along the line IV-IV in FIG. 3. The driving transistor 202, the write transistor 203, and the switching transistor 204 are disposed in the N-type well 402 provided on a P-type substrate 401. Insulator isolation, N-type diffusion layer isolation, or the like may be used as an element isolation portion 403 as needed. Examples of the insulator isolation include shallow trench isolation (STI), deep trench isolation (DTI), and local oxidation of silicon (LOCOS) isolation.

In FIG. 4, the diffusion region 305 is a region that holds a signal voltage. The diffusion region 305 is connected to the gate electrode 301 of the driving transistor 202. As described above, the diffusion region 306 is connected to the signal wire 108, and the gate electrode 304 is connected to the first scanning wire 106.

The power supply potential Vdd 206 is connected to the diffusion region 303 of the driving transistor 202 as described above. The diffusion region 308 of the switching transistor 204 is connected to the power supply potential Vss 207. The gate electrode 307 is connected to the second scanning wire 107.

As shown in FIG. 3 and FIG. 4, the element isolation portion 403 is disposed between the diffusion region 305 of the switching transistor 204 and the diffusion region 308 of the write transistor 203. Here, when there is a lattice defect at point A in the interface between the well 402 and the element isolation portion 403, holes from the lattice defect flow into a neighboring P-type diffusion region due to an electric field of a depletion layer formed around the P-type diffusion region. For example, as shown in FIG. 4, it is assumed that a write transistor is disposed to the left side of the element isolation portion 403 and a switching transistor is disposed to the right side of the element isolation portion 403.

In this case, holes from the lattice defect flow into the diffusion region of the write transistor or the diffusion region of the switching transistor. When the depth of the diffusion region of the write transistor is made equal to the depth of the diffusion region of the switching transistor, the holes from point A may flow into the diffusion region of the write transistor and, as a result, the luminance of the light emitting element 201 may change.

Here, in the specification, a depth direction is a direction from a side where the transistors are disposed (first side) toward a side opposite from the first side (second side) in a semiconductor substrate.

In the present embodiment, as shown in FIG. 4, the diffusion region 308 connected to the power supply potential Vss 207 in the driving transistor is formed to a deeper position than the diffusion region 305 of the write transistor that holds a signal voltage. Thus, holes from the lattice defect at point A easily flow into the diffusion region 308, and flow of the holes into the diffusion region 305 is reduced. Therefore, flow of the holes into the write transistor is reduced, and a change in signal voltage is reduced. Therefore, a luminance change of the light emitting element 201 is reduced. The diffusion region 308 of the driving transistor is connected to the power supply potential Vss as described above, so holes from a lattice defect can be discharged even when holes flow into the diffusion region 308.

The depth of the diffusion region 305 can be shallower than the depth of the element isolation portion 403. Thus, holes from a lattice defect that occurs at the interface of the element isolation portion 403 are difficult to flow into the diffusion region 305. The diffusion region 308 may be deeper than the element isolation portion 403 and can be shallower than the element isolation portion 403 as shown in FIG. 4.

In addition, in plan view, when the diffusion region 308 is formed at a position closest to the diffusion region 305 of the write transistor 203, flow of holes into the diffusion region 305 is further suppressed. In other words, in plan view, the shortest distance between the diffusion region 308-side end of the diffusion region 305 and the diffusion region 305-side end of the diffusion region 308 is shorter than the shortest distance between the diffusion region 305 and the diffusion regions other than the diffusion region 308. Thus, a change in signal voltage held by the diffusion region 305 and a luminance change of the light emitting element 201 are reduced.

In the specification, the term "plan view" means a view in a direction vertical to a surface, on which gate electrodes are formed, of a semiconductor substrate in which diffusion regions are formed. The term "cross section" means a plane in a direction vertical to the surface of the semiconductor substrate on which the gate electrodes are formed. When the surface of the semiconductor substrate is microscopically a rough surface, a plan view is defined with reference to the surface of the semiconductor substrate when viewed macroscopically.

As described above, according to the present embodiment, a luminance change of the light emitting element 201 is reduced by reducing a change in signal voltage. In a display apparatus in which a plurality of the light emitting elements 201 is arranged in a row direction and a column direction, high-quality display with reduced luminance unevenness can be achieved.

FIG. 1 to FIG. 4 show an example of a light emitting apparatus in which the plurality of pixels 102 is disposed in a matrix, and similar benefits are obtained even when a light emitting apparatus includes one pixel 102.

FIG. 2 and FIG. 3 illustrate the diffusion region 308 of the switching transistor and the diffusion region 305 of the write transistor 203 in one pixel 102; however, the layout of the pixel 102 is not limited thereto. For example, it is assumed that the diffusion region 305 that holds a signal voltage of a first pixel and the diffusion region 308 of the switching transistor 204 of a second pixel different from the first pixel are disposed adjacent to each other. In this case as well, when the diffusion region 308 is formed to a position deeper than the diffusion region 305, holes from a lattice defect of the element isolation portion 403 easily flow into the diffusion region 308, so benefits similar to the above are obtained.

Second Embodiment

Figure 5:
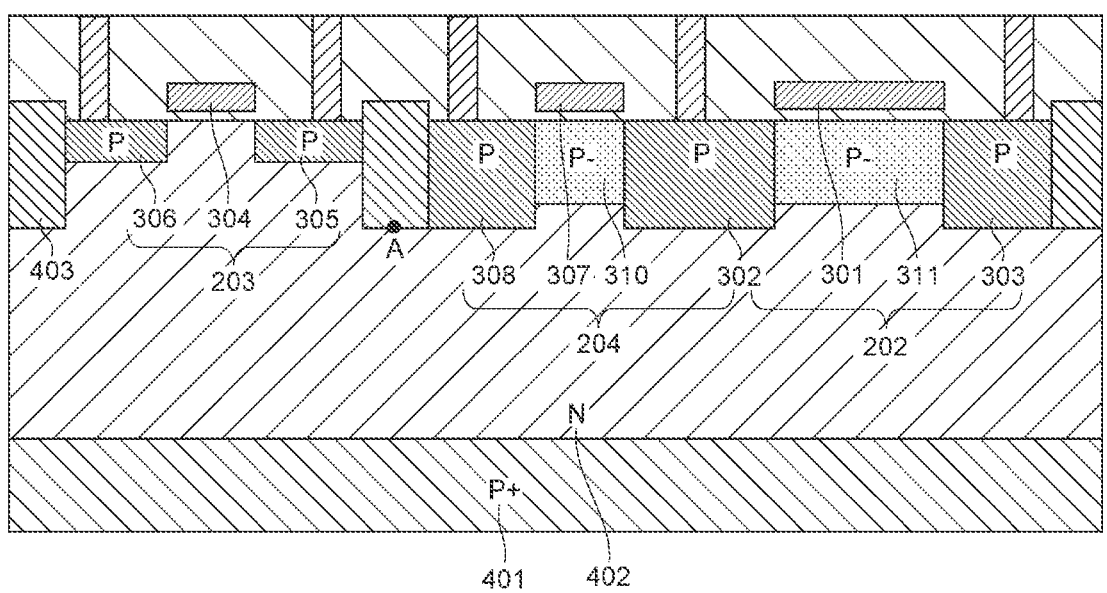
FIG. 5 is a schematic sectional view showing a configuration example of a pixel of the light emitting apparatus according to a second embodiment.

FIG. 5 shows a schematic sectional view of a light emitting apparatus according to a second embodiment. The plan view of the light emitting apparatus is omitted because the plan view is similar to that of FIG. 3. The present embodiment differs from the first embodiment in that the channel region of the switching transistor 204 and the channel region of the driving transistor 202 are buried channels. The configuration other than this point and matters described below is substantially the same as that of the first embodiment, so the description is omitted.

As shown in FIG. 5, the write transistor 203 can be a surface-channel transistor to reduce leakage current to the diffusion region 305 that holds a signal voltage.

On the other hand, since a relatively large current flows at the time when the light emitting element 201 is caused not to emit light, the switching transistor 204 can have a small resistance and can be configured as a buried-channel transistor. The driving transistor 202 can be a buried-channel transistor to reduce variations due to the characteristics of the transistors among pixels. In this way, in the present embodiment, a buried-channel transistor and a surface-channel transistor are used in accordance with the desired characteristics of transistors.

Between the diffusion region 302 and the diffusion region 308 that make up the switching transistor 204, a P-type diffusion region 310 of which the impurity concentration is lower than the impurity concentration of the P-type diffusion region 302 is disposed. The diffusion region 310 is disposed under the gate electrode 307 of the switching transistor 204. Between the diffusion region 302 and the diffusion region 303 that make up the driving transistor 202, a P-type diffusion region 311 of which the impurity concentration is lower than the impurity concentration of the P-type diffusion region 302 is disposed. The diffusion region 311 is disposed under the gate electrode 301 of the driving transistor 202.

According to the present embodiment, as in the case of the first embodiment, a luminance change of the light emitting element 201 is reduced by reducing a change in signal voltage. In a display apparatus in which a plurality of the light emitting elements 201 is arranged in a row direction and a column direction, high-quality display with reduced luminance unevenness can be achieved. Furthermore, since a buried channel and a surface channel are combined in accordance with the desired characteristics of transistors, it is possible to reduce a decrease in the characteristics of the light emitting apparatus.

Third Embodiment

A light emitting apparatus according to a third embodiment will be described with reference to FIG. 6 to FIG. 9. The present embodiment differs from the first embodiment in that the pixel 102 includes a switching transistor 601 that controls a current supplied from the power supply potential Vdd 206 to the driving transistor 202. The configuration other than this point and matters described below is similar to that of the first embodiment, so the description is omitted.

Figure 6:
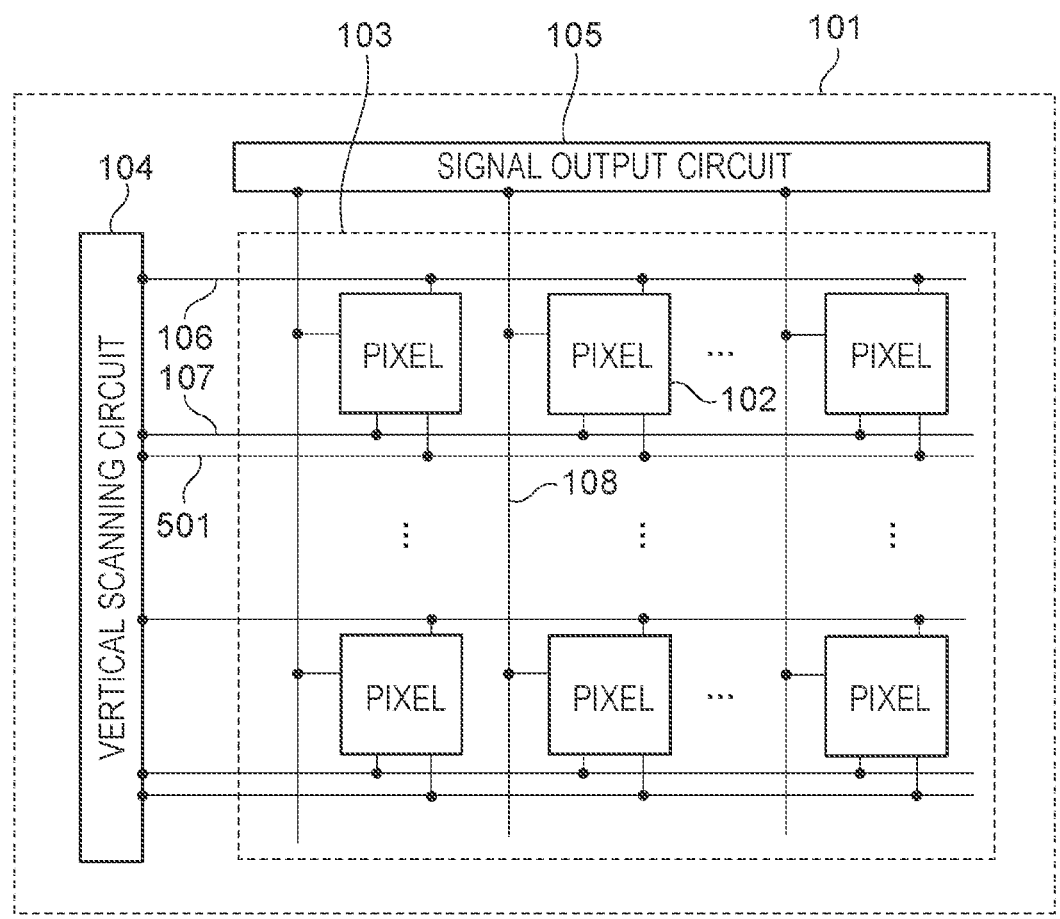
FIG. 6 is a diagram showing a configuration example of a light emitting apparatus according to a third embodiment.

FIG. 6 is a schematic diagram of the configuration of an active matrix display apparatus including the light emitting apparatus according to the present embodiment. As shown in FIG. 6, in the pixel array section 103, a second scanning wire 501 is disposed in the row direction for each pixel row. The second scanning wires 501 are connected to output terminals of associated rows in the vertical scanning circuit 104 and supply light emitting control signals to the pixels 102.

Figure 7:
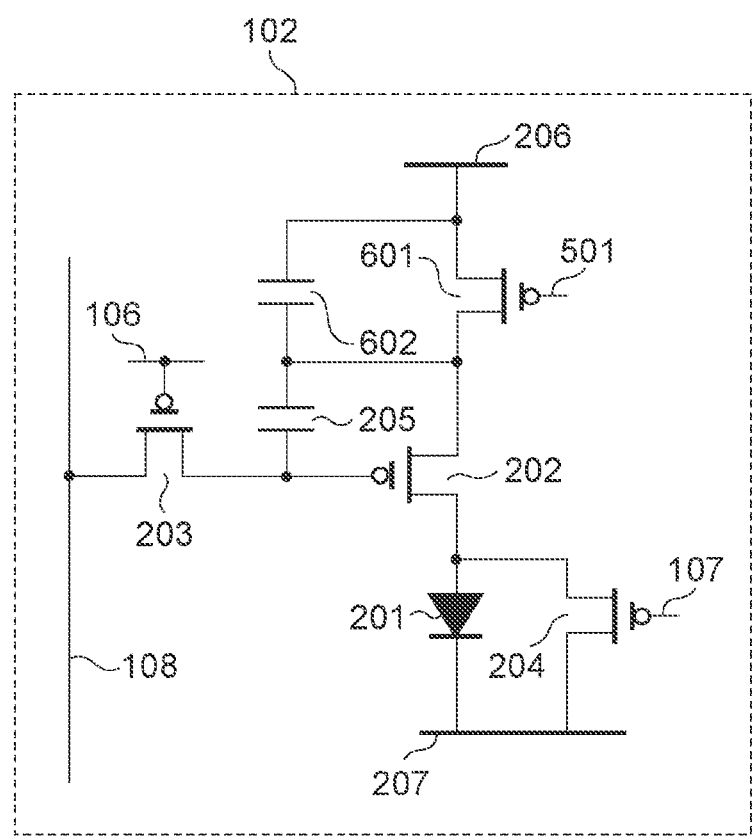
FIG. 7 is a circuit diagram showing a configuration example of a pixel of the light emitting apparatus according to the third embodiment.

FIG. 7 is an equivalent circuit diagram of each pixel 102 of the light emitting apparatus of FIG. 6. As shown in FIG. 7, one terminal (the drain region in FIG. 7) of the switching transistor 601 is connected to one terminal (the source region in FIG. 7) of the driving transistor 202. The other terminal (the source region in FIG. 7) of the switching transistor 601 is connected to the power supply potential Vdd 206. The gate of the switching transistor 601 is connected to the second scanning wire 501.

A capacitative element 602 is connected between the source region of the driving transistor 202 and the power supply potential Vdd 206. The capacitative element 602 may have at least one of a parasitic capacitance and a metal-insulator-metal (MIM) structure.

The switching transistor 601 is set to a conductive state in accordance with a light emission control signal applied to the gate via the second scanning wire 501 from the vertical scanning circuit 104 to supply a current from the power supply potential Vdd 206 to the driving transistor 202. Thus, the light emitting element 201 is enabled to emit light by the driving transistor 202. In other words, the switching transistor 601 has a function of a transistor that controls emission and non-emission of the light emitting element 201. In this way, with the switching operation of the switching transistor 601, it is possible to control the ratio between the emission period and non-emission period of the light emitting element 201, that is, so-called duty control. With this duty control, an afterimage blur resulting from light emission of the pixels 102 over one frame period is reduced, and, particularly, image quality in motion picture is improved.

Due to variations during manufacturing, the threshold of the driving transistor 202 can vary among pixels. In this case, when the same signal voltage is written to a plurality of pixels having the same emission color, the amount of current flowing through the driving transistor 202 varies pixel by pixel, and the quantity of light emission is not uniform. For this reason, before a signal voltage is written, a so-called threshold correction operation to hold a threshold between the gate and source of the driving transistor 202 is performed. With this threshold correction operation, variations in the amount of current of the driving transistor 202 among the pixels are reduced, so further uniform light emission is achieved.

In the threshold correction operation, after a current is passed to the light emitting element 201 via the switching transistor 601 and the driving transistor 202, the switching transistor 601 is set to an off state. Thus, until the voltage between the gate and source of the driving transistor 202 becomes statically determinate, a current flows through the light emitting element 201, and threshold correction is performed.

Figure 8:
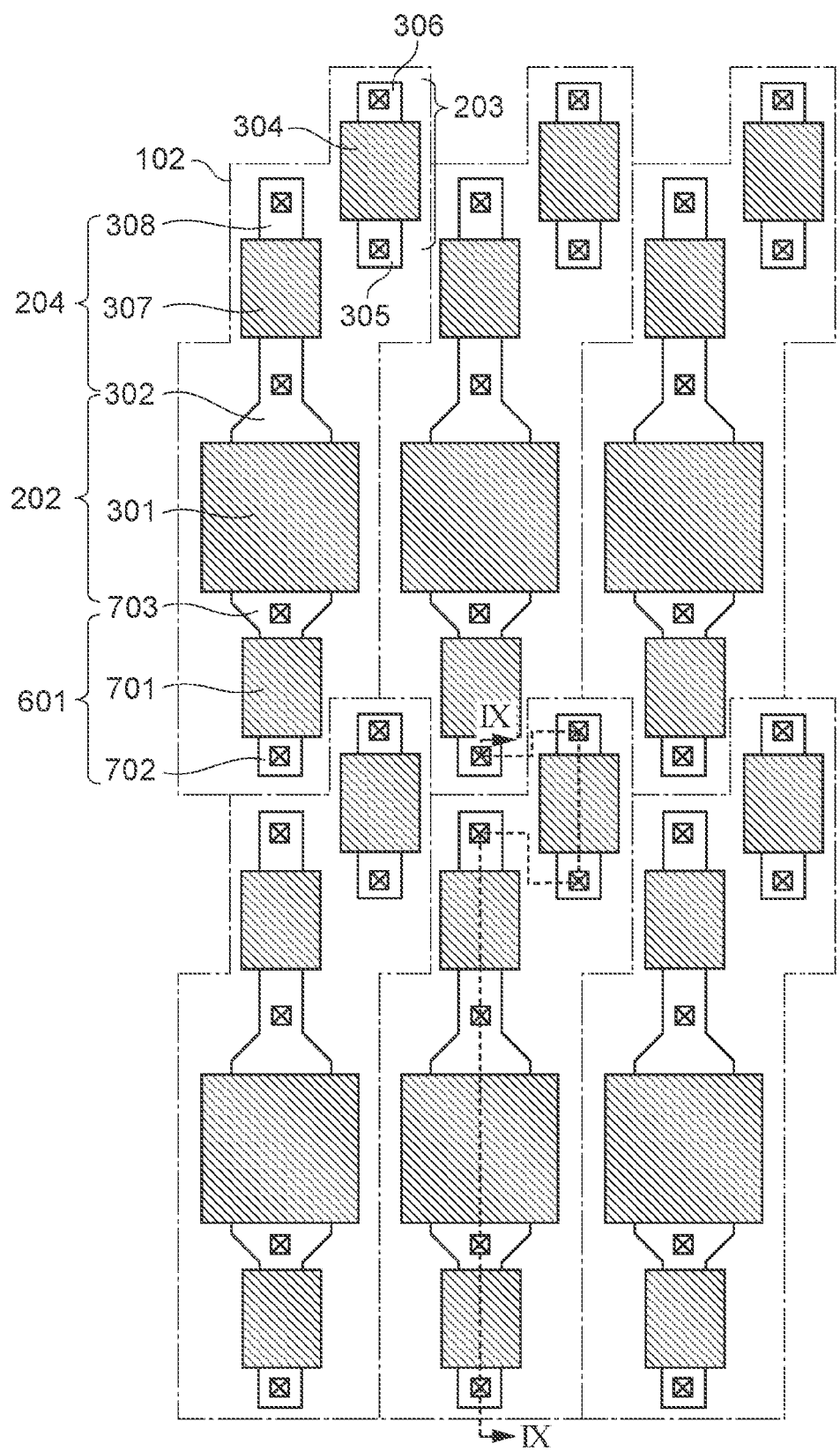
FIG. 8 is a schematic plan view showing a configuration example of pixels of the light emitting apparatus according to the third embodiment.

FIG. 8 is a plan view of the pixels 102 in the present embodiment. Each switching transistor 601 is made up of a gate electrode 701, a P-type diffusion region 702, and a P-type diffusion region 703. The gate electrode 701 is connected to the second scanning wire 501. The diffusion region 703 is shared with the driving transistor 202. However, the configuration is not limited thereto. The diffusion region of the driving transistor 202 and the diffusion region of the switching transistor 601 may be isolated from each other.

The write transistor 203 is disposed between the switching transistor 204 of one pixel and the switching transistor 204 of an adjacent pixel. In other words, the pixels are disposed such that an active region in which the switching transistor 204 is disposed and an active region in which the write transistor 203 is disposed are arranged in a staggered manner. Thus, pixel size is reduced. Such an arrangement is not indispensable, and an active region in which the switching transistor 204 is disposed and an active region in which the write transistor 203 is disposed may be arranged in a line. Alternatively, an active region in which the switching transistor 204 is disposed and an active region in which the write transistor 203 is disposed may be arranged such that the gate electrode of the switching transistor 204 and the gate electrode of the write transistor 203 are arranged in a row direction.

A diffusion region 702 is connected to the power supply potential Vdd 206 and one terminal of the capacitative element 602. The diffusion region 703 is connected to the other terminal of the capacitative element 602. In plan view, the diffusion region closest to the diffusion region 305 may be the diffusion region 702.

Figure 9:
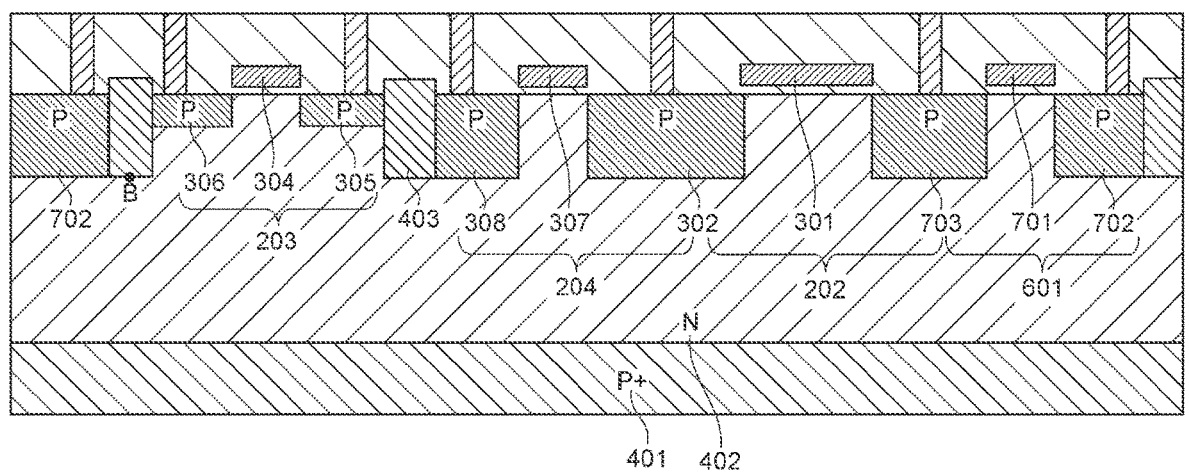
FIG. 9 is a schematic sectional view showing a configuration example of a pixel of the light emitting apparatus according to the third embodiment.

FIG. 9 is a sectional view taken along the line IX-IX in FIG. 8. In the present embodiment, the switching transistor 601 is disposed in the N-type well 402. Here, when there is a lattice defect at point B in the interface between the well 402 and the element isolation portion 403, electrons from the lattice defect randomly move due to diffusion and flow into a neighboring P-type diffusion region.

In the present embodiment, the diffusion region 702 connected to the power supply potential Vdd 206 is formed to a deeper position than the diffusion region 305 that holds a signal voltage. Thus, electrons from the lattice defect at point B easily flow into the diffusion region 702, and flow of the electrons into the diffusion region 305 is reduced.

With such a configuration, a change in signal voltage held by the diffusion region 305 and a luminance change of the light emitting element 201 are suppressed, so high-quality display can be achieved. Furthermore, variations in the amount of current of the driving transistor 202 among the pixels are reduced, so further uniform light emission is achieved.

Fourth Embodiment

A light emitting apparatus according to a fourth embodiment will be described with reference to FIG. 10. The present embodiment differs from the third embodiment in that the diffusion region 302 is shallower than the diffusion region 308. The configuration other than this point and matters described below is similar to that of the first embodiment, so the description is omitted.

Figure 10:
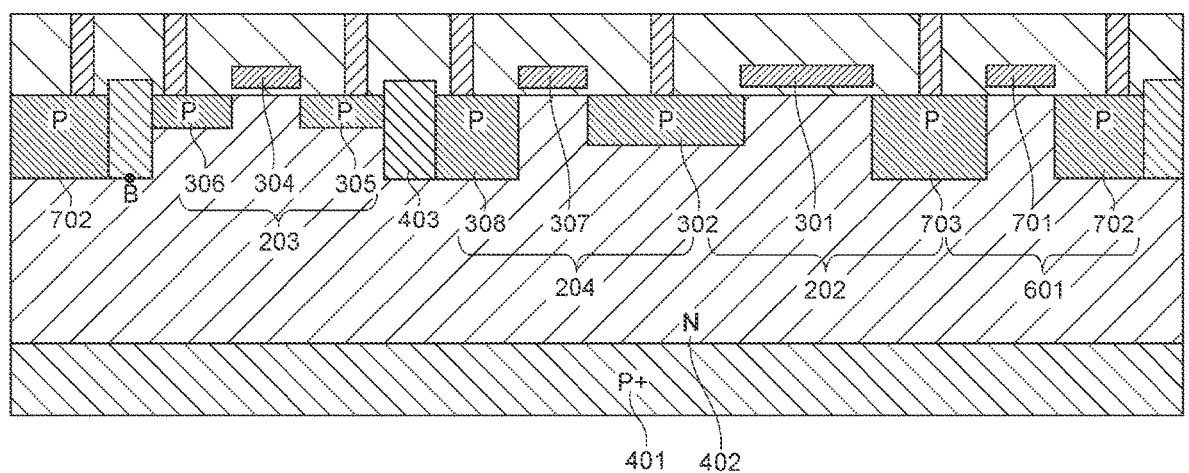
FIG. 10 is a schematic sectional view showing a configuration example of a pixel of a light emitting apparatus according to a fourth embodiment.

As shown in FIG. 10, the diffusion region 302 is disposed to a shallower position than the diffusion region 308. Even when the diffusion region 302 is not formed to the same depth as the diffusion region 308 in this way, benefits similar to those of the third embodiment are obtained. In other words, a change in signal voltage held by the diffusion region 305 and a luminance change of the light emitting element 201 are suppressed, so high-quality display can be achieved. Furthermore, variations in the amount of current of the driving transistor 202 among the pixels are reduced, so further uniform light emission is achieved.

Fifth Embodiment

A light emitting apparatus according to a fifth embodiment will be described with reference to FIG. 11. The present embodiment differs from the third embodiment in that each transistor has a lightly doped drain (LDD) structure. Of a diffusion region 313 and a diffusion region 314 that form the LDD structure of the write transistor 203, a distance d22 of the diffusion region 314 is greater than a distance d21 of the diffusion region 313. The drain region and the source region of the write transistor 203 respectively have chemical compound regions 315, 316. The configuration other than these points and matters described below is similar to that of the third embodiment, so the description is omitted.

In the write transistor 203, the chemical compound regions 315, 316 are disposed in connection regions for contact plugs. The chemical compound region 315 is a silicide region obtained by reacting part of the diffusion region 306 with a metal. The chemical compound region 316 is a silicide region obtained by reacting part of the diffusion region 305 with a metal. Chemical compound regions are also similarly disposed in other transistors.

The distance d21 is the length of the source region-side LDD region of the write transistor 203 in a direction in which a current flows. The distance d22 is the length of the drain region-side LDD region of the write transistor 203 in a direction in which a current flows. For example, the distance d21 is a shortest distance from the diffusion region 306-side end of the diffusion region 313 to the end of a region where the channel of the transistor is formed. For example, the distance d22 is a shortest distance from the diffusion region 305-side end of the diffusion region 314 to the end of a region where the channel of the transistor is formed.

In plan view of the write transistor 203, the distance d23 is a distance from the end of the gate electrode 304 to the end of the chemical compound region 315, and the distance d24 is a distance from the end of the gate electrode 304 to the end of the chemical compound region 316.

In the present embodiment, the channel region-side end of the diffusion region 313 coincides with the end of the gate electrode 304 disposed on the channel region. Therefore, the length of the diffusion region 313 is a length in plan view between the end of the diffusion region 306 adjacent to the diffusion region 313 and the end of the gate electrode 304. The diffusion region 313 and the diffusion region 314 may be formed to the lower side of the gate electrode 304. Even in this case, when, for example, the length of part of each of the diffusion regions 313, 314, disposed under the gate electrode 304, is sufficiently small, the length between the end of the diffusion region 306 and the diffusion region 313-side end of the gate electrode 304 in plan view may be regarded as the length of the diffusion region 313.

Figure 11:
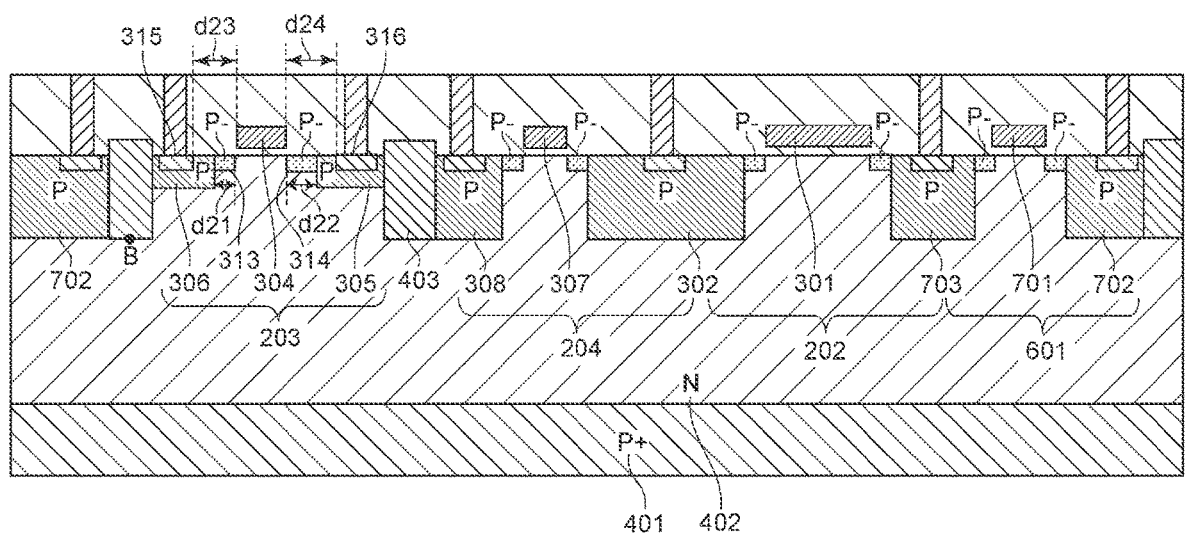
FIG. 11 is a schematic sectional view showing a configuration example of a pixel of a light emitting apparatus according to a fifth embodiment.

As shown in FIG. 11, the chemical compound region 316 can be spaced apart from the gate electrode 304.

A region with a lower P-type impurity concentration can be arranged in order from the gate electrode 304 side. In FIG. 11, the diffusion region 314, the diffusion region 305, and the chemical compound region 316 are disposed in order from the gate electrode 304 side. Thus, an off-leakage current (described later) is easily reduced.

As described above, the potential of the gate electrode 301 of the driving transistor 202 determines the drain current of the driving transistor 202 and determines the luminance of the light emitting element 201. Therefore, as the potential of the diffusion region 305 that functions as the drain region of the write transistor 203 fluctuates, the magnitude of drain current of the driving transistor 202 fluctuates, and the luminance of the light emitting element 201 also fluctuates. For this reason, to stabilize the luminance of the light emitting element 201, the potential of the drain region of the write transistor 203 is to be stable.

However, in an off state of the write transistor 203, the potential of the gate electrode 304 and the potential of the well 402 are different from the potential of the diffusion region 305 that functions as the drain region. For this reason, due to these potential differences, an electric field is generated in at least one between the gate electrode 304 and the diffusion region 305 that functions as the drain region or between the well 402 and the diffusion region 305 that functions as the drain region. When a leakage current (hereinafter, also referred to as off-leakage current) occurs due to the electric field, the potential of the diffusion region 305 that functions as the drain region of the write transistor 203 fluctuates, with the result that the potential of the gate electrode 304 of the driving transistor 202 fluctuates. When the leakage current is large, the potential of the gate electrode 301 of the driving transistor 202 approaches the potential of the diffusion region 302 that functions as the source region of the driving transistor 202. As a result, a current is difficult to flow through the light emitting element 201, and light emission of the pixel 102 in which a leakage current has occurred is suppressed. Depending on the magnitude of leakage current, no current flows through the light emitting element 201, the pixel 102 does not emit light, and a portion corresponding to the pixel 102 in a display image can become black. In this way, when a leakage current occurs in the write transistor 203 in an off state, the emission luminance of the light emitting element 201 becomes instable, and, as a result, the grade of light emission or display of the light emitting apparatus 101 decreases.

In the present embodiment, the distance d24 from the end of the gate electrode 304 of the write transistor 203 to the end of the chemical compound region 316 is longer than the distance d23 from the end of the gate electrode 304 of the write transistor 203 to the end of the chemical compound region 315. In other words, distance d24>distance d23 holds. In other words, in the write transistor 203, the distance from the drain region-side chemical compound region to the gate electrode is longer than the distance from the source region-side chemical compound region of the write transistor 203 to the gate electrode. Thus, in the diffusion region 305 that functions as the drain region, a physical distance between the gate electrode 304 and the chemical compound region 316 connected to the gate electrode 301 of the driving transistor 202 via a contact plug and having a lower resistivity can be increased. In addition, a physical distance between the chemical compound region 316 and part of the well 402, disposed just under the gate electrode 304 (that is, a channel region) can be increased. In the present embodiment, with this configuration, an electric field generated between the gate electrode 304 and the chemical compound region 316 in the drain region of the write transistor 203 and an electric field generated between the channel region and the chemical compound region 316 are reduced. More specifically, the electric field in the drain region of the write transistor 203 can be made smaller than the electric field in the source region of the write transistor 203. With the configuration to reduce electric fields in this way, occurrence of an off-leakage current in the drain region of the write transistor 203 is suppressed. Thus, the potential of the gate electrode 301 of the driving transistor 202 is stabilized, and the emission luminance of the light emitting element 201 is stabilized. As a result, the grade of light emission or display of the light emitting apparatus 101 is improved.

Sixth Embodiment

The light emitting apparatuses according to the above-described embodiments each may be used as a constituent member of a display apparatus or a constituent member of an illumination apparatus. Other than those, there are uses, such as an exposure light source of an electrophotographic image forming apparatus and a light emitting apparatus including a color filter for a backlight or white light source of a liquid crystal display apparatus.

A display apparatus may be an image information processing apparatus. The image information processing apparatus includes an image input section that enters image information from an area CCD, a linear CCD, a memory card, or the like, and an information processing section that processes input information. The image information processing apparatus displays the input image on a display section.

A display section of an image pickup apparatus or ink-jet printer may have a touch panel function. A drive system of the touch panel function may be an infrared radiation system, a capacitance system, a resistive film system, or an electromagnetic induction system and is not limited. A display apparatus may be used as a display section of a multifunction printer.

Next, a display apparatus according to the present embodiment will be described with reference to the attached drawings.

Figure 12:
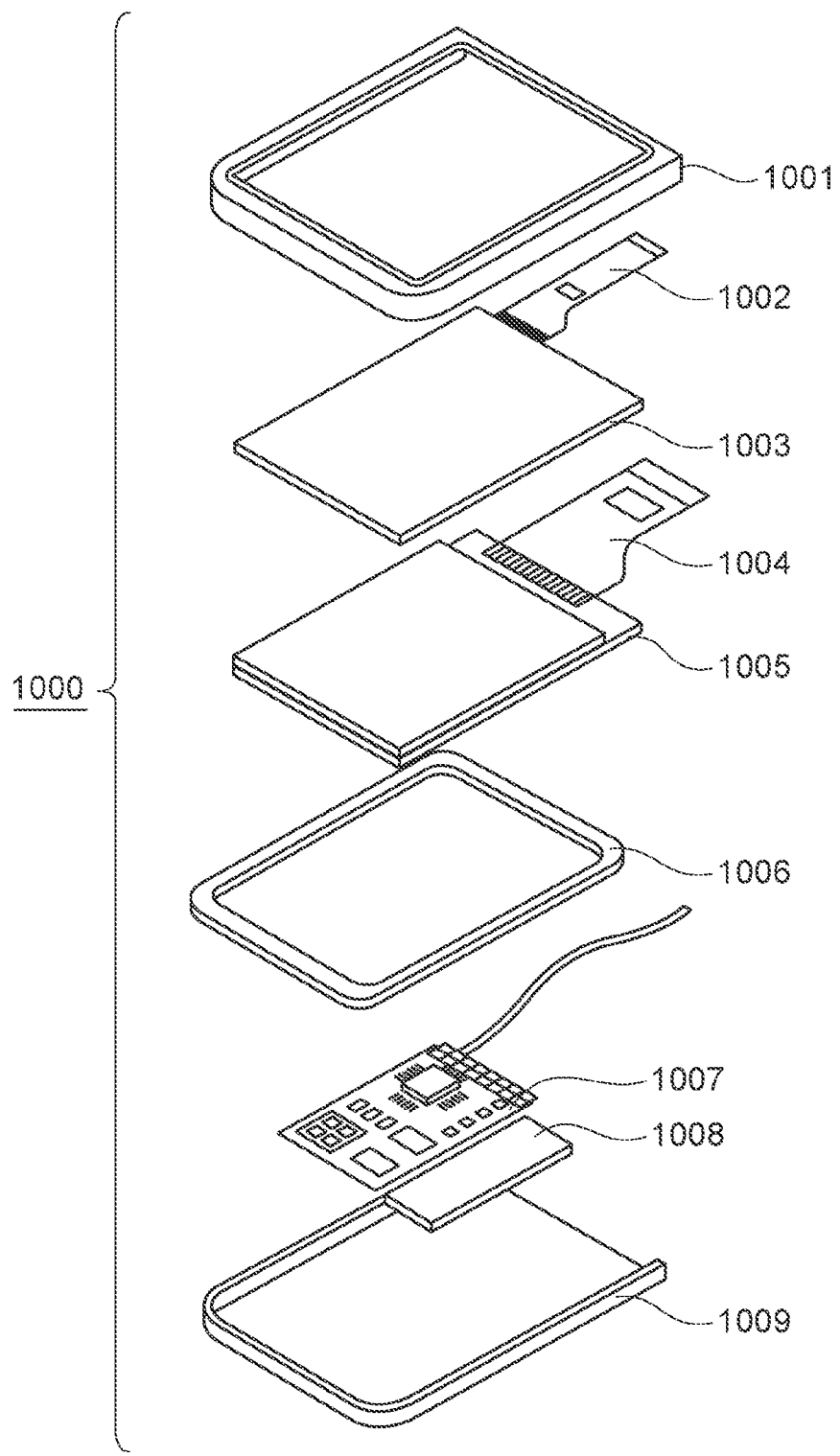
FIG. 12 is a view showing a specific example of an electronic device according to a sixth embodiment.

FIG. 12 is a schematic view showing an example of the display apparatus according to the present embodiment. A display apparatus 1000 may include a touch panel 1003, a display panel 1005, a frame 1006, a circuit board 1007, and a battery 1008 between a top cover 1001 and a bottom cover 1009. A flexible printed circuit (FPC) 1002 is connected to the touch panel 1003. A flexible printed circuit (FPC) 1004 is connected to the display panel 1005. Transistors are provided on or in the circuit board 1007. The battery 1008 does not need to be provided when the display apparatus is not a mobile device, and may be provided at another position even when the display apparatus is a mobile device. A control section that controls display of the display apparatus may be made up of the above-described transistors and the like. A known method using a CPU and the like may be used as the control section. In other words, the display apparatus according to the present embodiment includes a light emitting apparatus and a control section that controls display of the light emitting apparatus.

The display apparatus according to the present embodiment may include red, green, and blue color filters. The red, green, and blue color filters may be disposed in a delta array or in a stripe array.

The display apparatus according to the present embodiment may be used in a display section of a mobile terminal. In this case, the display apparatus may have a display function and an operating function. The mobile terminal may be a cellular phone, such as a smartphone, a tablet, a head mounted display, or the like. When used as the display apparatus, the display apparatus may be used with a magnification optical system.

The display apparatus according to the present embodiment may be used in a display section of an image pickup apparatus including an optical section having a plurality of lenses and an image pickup device that receives light passing through the optical section. The image pickup apparatus may include a display section that displays information acquired by the image pickup device. The display section may be a display section exposed to the outside of the image pickup apparatus or may be a display section disposed in a viewfinder. The image pickup apparatus may be a digital camera or a digital camcorder.

Figure 13A:
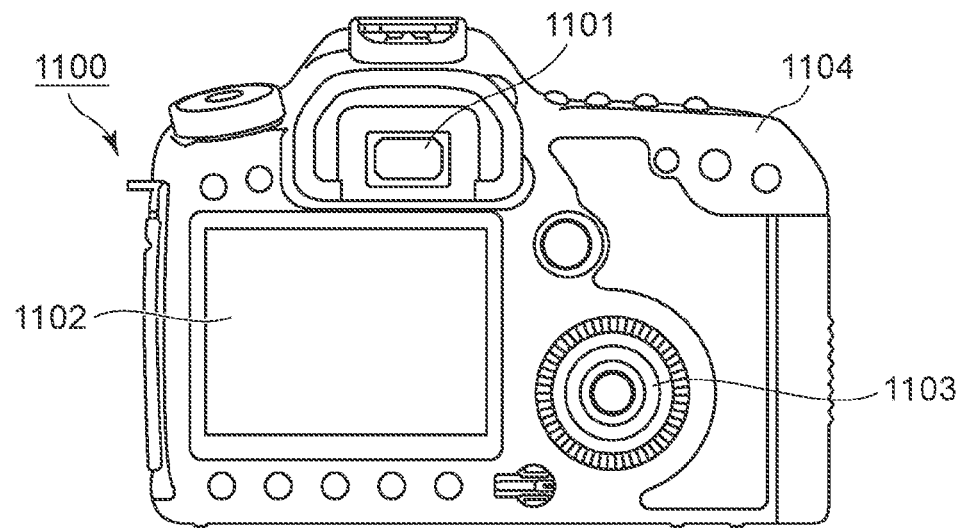
FIG. 13A and FIG. 13B are views showing specific examples of the electronic device according to the sixth embodiment.

FIG. 13A is a schematic view showing an example of an image pickup apparatus according to the present embodiment. An image pickup apparatus 1100 may include a viewfinder 1101, a back display 1102, an operation section 1103, and a housing 1104. The viewfinder 1101 may include the display apparatus according to the present embodiment. In this case, the display apparatus is not limited to displaying only an image to be picked up and may display environmental information, an image pickup instruction, or the like. The environmental information may include the intensity of external light, the direction of external light, the moving speed of an object, a possibility that an object is shielded by a shielding material, or the like.

Since suitable timing for image pickup is a slight amount of time, information is displayed as early as possible. Therefore, among display apparatuses using the light emitting apparatuses according to the embodiments of the disclosure, an organic light emitting apparatus can be used. This is because an organic light emitting element has a higher response speed. The display apparatus using organic light emitting elements is more suitably used than a liquid crystal display apparatus for these apparatuses of which a higher display speed is desired.

The image pickup apparatus 1100 includes an optical section (not shown). The optical section has a plurality of lenses and forms an image on the image pickup device accommodated in the housing 1104. The plurality of lenses is capable of adjusting a focal point by adjusting the relative positions of the lenses. This operation can be automatically performed. The image pickup apparatus may be called a photoelectric conversion apparatus. The photoelectric conversion apparatus can include not sequentially picking up an image but a method of detecting a difference from a previous image, a method of extracting an image from an image being constantly recorded, or the like, as a method of picking up an image.

Figure 13B:
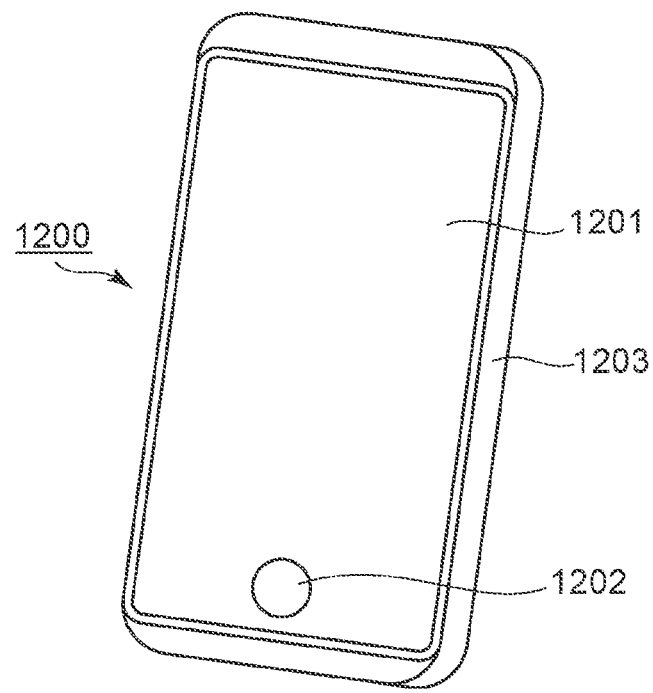

FIG. 13B is a schematic view showing an example of an electronic device according to the present embodiment. An electronic device 1200 includes a display section 1201, an operation section 1202, and a housing 1203. The housing 1203 may contain a circuit, a printed board having the circuit, a battery, and a communication section. The operation section 1202 may be a button or may be a touch panel-type response section. The operation section may be a biometric authentication section that identifies a fingerprint to, for example, release a lock. The electronic device including a communication section may be regarded as a communication device. The electronic device may further have a camera function by including a lens and an image pickup device. An image picked up by the camera function is shown on the display section. The electronic device may be a smartphone, a notebook computer, or the like.

Figure 14A:
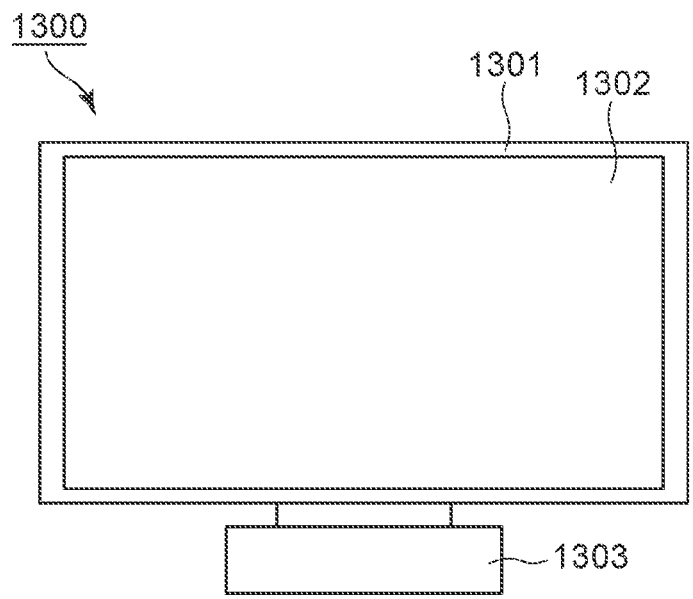
FIG. 14A and FIG. 14B are views showing specific examples of the electronic device according to the sixth embodiment.
Figure 14B:
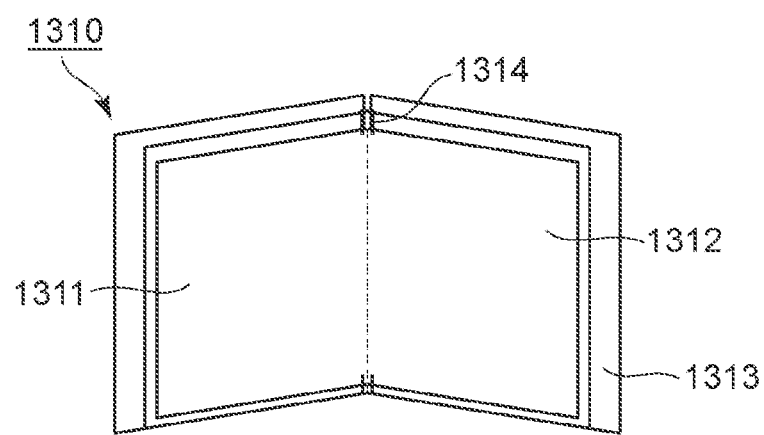

FIG. 14A and FIG. 14B are schematic views showing examples of the display apparatus according to the present embodiment. FIG. 14A is a display apparatus, such as a television monitor and a PC monitor. A display apparatus 1300 includes a frame 1301 and a display section 1302. The light emitting apparatus according to the present embodiment may be used as the display section 1302.

The display apparatus 1300 includes a base 1303 that supports the frame 1301 and the display section 1302. The base 1303 is not limited to the mode of FIG. 14A. The bottom side of the frame 1301 may serve as a base.

The frame 1301 and the display section 1302 may be curved. The radius of curvature may be greater than or equal to 5000 mm and less than or equal to 6000 mm.

FIG. 14B is a schematic view showing another example of the display apparatus according to the present embodiment. A display apparatus 1310 of FIG. 14B is configured to be foldable, and is a so-called foldable display apparatus. The display apparatus 1310 includes a first display section 1311, a second display section 1312, a housing 1313, and a folding point 1314. The first display section 1311 and the second display section 1312 each may include the light emitting apparatus according to the present embodiment. The first display section 1311 and the second display section 1312 may make up a seamless one display apparatus. The first display section 1311 and the second display section 1312 may be separated at the folding point. The first display section 1311 and the second display section 1312 may respectively display different images or the first and second display sections 1311, 1312 may display one image.

Figure 15A:
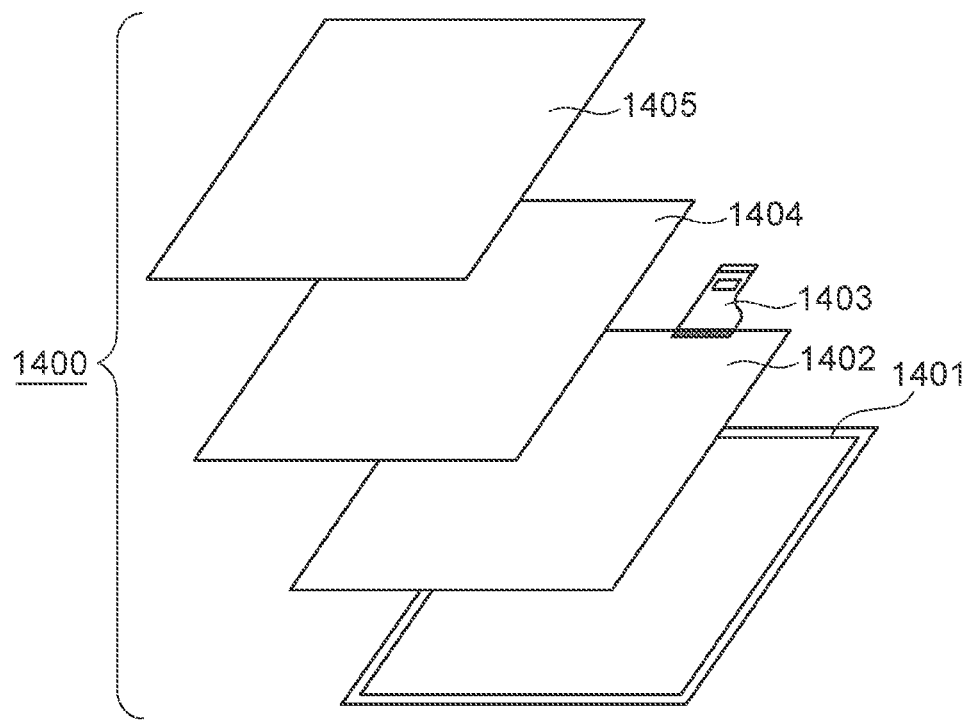
FIG. 15A and FIG. 15B are views showing specific examples of the electronic device according to the sixth embodiment.

FIG. 15A is a schematic view showing an example of an illumination apparatus according to the present embodiment. An illumination apparatus 1400 may include a housing 1401, a light source 1402, a circuit board 1403, an optical filter 1404, and a light diffusion section 1405. The light source may include organic light emitting elements according to the present embodiment. The optical filter may be a filter that improves the color rendering property of the light source. The light diffusion section is capable of effectively diffusing light from the light source for illumination or the like to bring light to a wide range. The optical filter and the light diffusion section may be provided on a light emission side of illumination. Where necessary, a cover may be provided at an outermost part.

The illumination apparatus is an apparatus that illuminates, for example, a room. The illumination apparatus may emit light in any one of white color, daylight color, and other colors from blue to red. The illumination apparatus may include a light modulating circuit that modulates light of any one of those colors.

The illumination apparatus may include organic light emitting elements according to the embodiment of the disclosure and a power supply circuit connected to those elements. The power supply circuit is a circuit that converts alternating-current voltage to direct-current voltage. White has a color temperature of 4200 K, and daylight color has a color temperature of 5000 K. The illumination apparatus may include a color filter.

The illumination apparatus according to the present embodiment may include a heat radiation section. The heat radiation section is to release heat inside the apparatus to the outside of the apparatus and may be made of a metal having a high specific heat, liquid silicon, or the like.

Figure 15B:
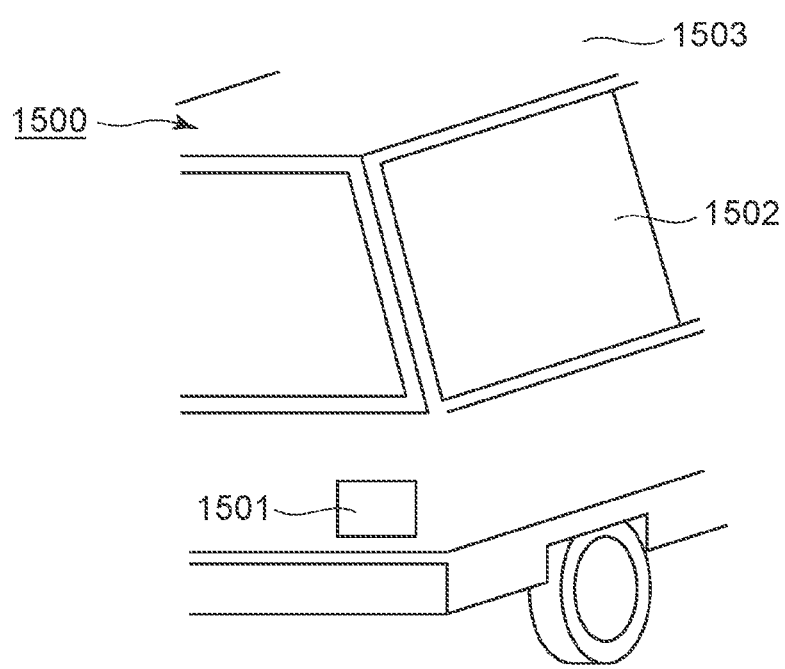

FIG. 15B is a schematic view of an automobile that is an example of a moving object according to the present embodiment. The automobile includes a tail lamp that is an example of a lamp. The automobile 1500 includes the tail lamp 1501 and may be configured to, when brake operation or the like is performed, turn on the tail lamp 1501.

The tail lamp 1501 may include the organic light emitting elements according to the present embodiment. The tail lamp may include a protective member that protects the OLED elements. The protective member may be made of any material as long as the protective member has a high strength to a certain extent and can be made of polycarbonate or the like. A furan dicarboxylic acid derivative, an acrylonitrile derivative, or the like may be mixed with polycarbonate.

The automobile 1500 may include a body 1503 and windows 1502 fixed to the body 1503. The windows 1502 other than windows for viewing the front and rear of the automobile 1500 each may be a transparent display. The transparent display may include the organic light emitting elements according to the present embodiment. In this case, the constituent materials of the electrodes and the like of each organic light emitting element are made up of transparent members.

The moving object according to the present embodiment may be a ship, an airplane, a drone, or the like. The moving object may include a body and a lamp provided on the body. The lamp may emit light for informing a position of the body. The lamp includes the organic light emitting elements according to the present embodiment.

Application examples of the display apparatus of each of the above-described embodiments will be described with reference to FIG. 16A and FIG. 16B. The display apparatus is applicable to a wearable system as a wearable device, such as smartglasses, an HMD, and a smart contact lens. An image pickup and display apparatus used in such application examples includes an image pickup apparatus capable of performing photoelectric conversion of visible light and a display apparatus capable of emitting visible light.

Figure 16A:
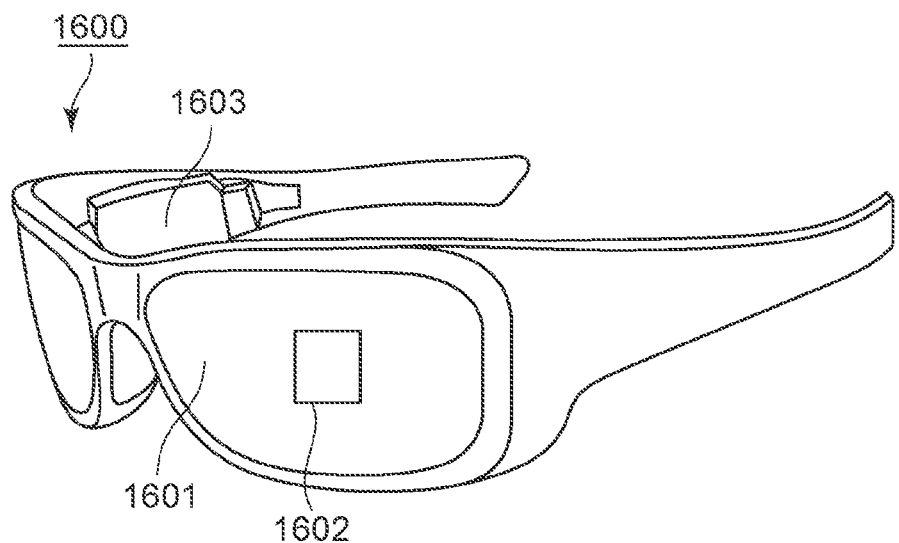
FIG. 16A and FIG. 16B are views showing specific examples of the electronic device according to the sixth embodiment.

FIG. 16A illustrates glasses 1600 (smartglasses) according to one application example. An image pickup apparatus 1602, such as a CMOS sensor and an SPAD, is provided on the surface side of a lens 1601 of the glasses 1600. In addition, the display apparatus of any one of the above-described embodiments is provided on the back surface side of the lens 1601.

The glasses 1600 further include a controller 1603. The controller 1603 functions as a power supply to supply electric power to the image pickup apparatus 1602 and the display apparatus of any one of the embodiments. The controller 1603 controls the operations of the image pickup apparatus 1602 and the display apparatus. An optical system for gathering light to the image pickup apparatus 1602 is formed in the lens 1601.

Figure 16B:
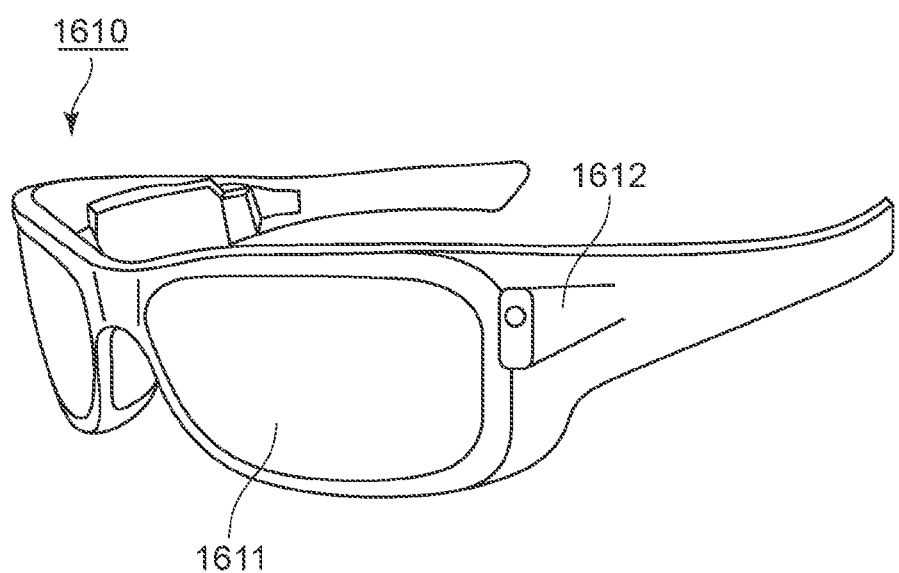

FIG. 16B illustrates glasses 1610 (smartglasses) according to one application example. The glasses 1610 include a controller 1612, and an image pickup apparatus corresponding to the image pickup apparatus 1602, and the display apparatus are installed in the controller 1612. The image pickup apparatus in the controller 1612 and an optical system for projecting light emitted from a display apparatus are formed in a lens 1611, and an image is projected onto the lens 1611. The controller 1612 functions as a power supply to supply electric power to the image pickup apparatus and the display apparatus and also controls the operations of the image pickup apparatus and the display apparatus. The controller may include a line-of-sight detection section that detects the line of sight of a wearer. Infrared radiation may be used to detect the line of sight. An infrared emitting section emits infrared light to the eye of a user gazing at a display image. Infrared light emitted and reflected from the eye is detected by an image pickup section including a light receiving element. Thus, a picked-up image of the eye is obtained. A reducer that reduces light from the infrared emitting section to the display section in plan view is provided, so a decrease in image quality is reduced.

The line-of-sight of the user toward the display image is detected from the picked-up image of the eye, obtained through image pickup using infrared light. A selected known technique may be applied to line-of-sight detection using a picked-up image of an eye. As an example, a line-of-sight detection method based on a Purkinje image caused by reflection of irradiation light on a cornea may be used.

More specifically, a line-of-sight detection process based on a pupil-cornea reflection method is performed. A line-of-sight vector indicating the orientation (rotational angle) of the eye is calculated in accordance with the pupil image contained in a picked-up image of the eye and a Purkinje image by using the pupil-cornea reflection method. Thus, the line of sight of a user is detected.

A display apparatus according to an embodiment of the disclosure may include an image pickup apparatus having a light receiving element and may control a display image of the display apparatus in accordance with information about the line of sight of a user from the image pickup apparatus.

Specifically, the display apparatus determines a first field of view area at which the user gazes and a second field of view area other than the first field of view area in accordance with line-of-sight information. A first field of view area and a second field of view area may be determined by the controller of the display apparatus or a first field of view area and a second field of view area determined by an external controller may be received. In a display area of the display apparatus, a display resolution of the first field of view area may be controlled so as to be higher than a display resolution of the second field of view area. In other words, the resolution of the second field of view area may be made lower than the resolution of the first field of view area.

A display area may include a first display area and a second display area different from the first display area, and an area having a higher priority may be determined in accordance with line-of-sight information from among the first display area and the second display area. A first field of view area and a second field of view area may be determined by the controller of the display apparatus or a first field of view area and a second field of view area determined by an external controller may be received. The resolution of an area having a higher priority may be controlled so as to be higher than the resolution of an area other than the area having a higher priority. In other words, the resolution of an area having a relatively lower priority may be decreased.

AI may be used to determine a first field of view area or an area having a higher priority. AI may be a model configured to estimate an angle of a line of sight and a distance to an object ahead of the line of sight from an image of an eye by using the images of the eye and corresponding directions in which the eye of the image is actually viewing as training data. The display apparatus, or the image pickup apparatus, or an external apparatus may include an AI program. When the external apparatus includes an AI program, the AI program is transmitted to the display apparatus via communication.

When display control is performed in accordance with line-of-sight detection, it is suitably applied to smartglasses further including an image pickup apparatus that picks up an outside. The smartglasses are capable of displaying picked-up outside information in real time.

As described above, with an apparatus using the organic light emitting elements according to the present embodiment, stable display can be performed even for a long time with good image quality.

Other Embodiments

The embodiments are described above; however, the disclosure is not limited to these embodiments. Various modifications and changes are possible. The embodiments are applicable to one another.

It is possible to provide a light emitting apparatus with a reduced change in luminance of a light emitting element.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-196896, filed Nov. 27, 2020 which is hereby incorporated by reference herein in its entirety.

What is claimed is:

1. An apparatus comprising:
a pixel that includes a current path including a light emitting element and a first transistor, a second transistor, and a third transistor connected to a signal wire, wherein
one of a source region and a drain region of the second transistor is connected to one node of the light emitting element and the other of the source region and the drain region of the second transistor is connected to a first power supply,
one of a source region and a drain region of the third transistor is connected to a gate electrode of the first transistor,
an isolation portion is disposed between a first conductivity type first diffusion region that makes up one of the source region and the drain region of the second transistor and a first conductivity type second diffusion region that makes up one of the source region and the drain region of the third transistor, and
a depth of the first diffusion region is greater than a depth of the second diffusion region.

2. The apparatus according to claim 1, wherein the pixel has a first capacitative element connected between the gate electrode and the source region or the drain region of the first transistor.

3. The apparatus according to claim 2, wherein the second diffusion region makes up part of the first capacitative element, and, when the third transistor is in a non-conductive state, the first capacitative element holds a luminance signal transmitted through the signal wire.

4. The apparatus according to claim 1, the first power supply is lower in power supply potential than a second power supply connected to another node of the light emitting element.

5. The apparatus according to claim 2, wherein the pixel has a second capacitative element connected between the gate electrode of the first transistor and a second power supply higher in power supply potential than the first power supply.

6. The apparatus according to claim 5, wherein the pixel has a fourth transistor connected between another node of the first transistor and the second power supply.

7. The apparatus according to claim 6, wherein
one node of the fourth transistor connected to the second power supply is made up of a third diffusion region, and
a depth of the third diffusion region is greater than the depth of the second diffusion region.

8. The apparatus according to claim 7, wherein, in plan view, a diffusion region closest to the second diffusion region is the third diffusion region.

9. The apparatus according to claim 1, wherein, in plan view, a diffusion region closest to the second diffusion region is the first diffusion region.

10. The apparatus according to claim 1, wherein the first transistor is a buried-channel transistor, and the third transistor is a surface-channel transistor.

11. The apparatus according to claim 1, wherein a channel of the first transistor and a channel of the second transistor each are a region of the first conductivity type.

12. The apparatus according to claim 11, wherein a channel of the third transistor is a region of a second conductivity type different from the first conductivity type.

13. The apparatus according to claim 1, wherein the isolation portion is an insulator separation.

14. The apparatus according to claim 1, wherein the isolation portion is disposed to a region deeper than the first diffusion region or the second diffusion region.

15. A device comprising:
the light emitting apparatus according to claim 1; and
a control unit configured to drive the apparatus.

16. The device according to claim 15, wherein the device is a digital camera, a digital camcorder, a smartphone, a tablet, a head mounted display, smart glasses, or a smart contact lens.

17. The device according to claim 15, wherein the pixel has a first capacitative element connected between the gate electrode and the source region or the drain region of the first transistor.

18. The device according to claim 15, the first power supply is lower in power supply potential than a second power supply connected to another node of the light emitting element.

19. The device according to claim 15, wherein the first transistor is a buried-channel transistor, and the second transistor is a surface-channel transistor.

20. The device according to claim 15, wherein a channel of the first transistor and a channel of the second transistor each are a region of the first conductivity type.

* * * * *